(12) United States Patent  
Barth, Jr. et al.

(10) Patent No.: US 8,227,310 B2  
(45) Date of Patent: Jul. 24, 2012

(54) INTEGRATED CIRCUITS COMPRISING AN ACTIVE TRANSISTOR ELECTRICALLY CONNECTED TO A TRENCH CAPACITOR BY AN OVERLYING CONTACT AND METHODS OF MAKING

(75) Inventors: John E. Barth, Jr., Williston, VT (US); Kangguo Cheng, Beacon, NY (US); Michael Sperling, Poughkeepsie, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 740 days.

(21) Appl. No.: 12/186,780

(22) Filed: Aug. 6, 2008

(65) Prior Publication Data

US 2010/0032742 A1 Feb. 11, 2010

(51) Int. Cl.
*H01L 21/8242* (2006.01)

(52) U.S. Cl. ............... 438/243; 257/301; 257/E27.092; 257/E21.651

(58) Field of Classification Search .................. 257/204, 257/259, 379, 516, 904, E21.653, E21.396, 257/E29.346, 301, E27.092, E21.651; 438/243
See application file for complete search history.

(56) References Cited

U.S. PATENT DOCUMENTS

| | | | |
|---|---|---|---|
| 5,360,758 A | 11/1994 | Bronner et al. | |
| 5,384,277 A | 1/1995 | Hsu et al. | |
| 6,063,657 A | 5/2000 | Bronner et al. | |
| 6,242,310 B1 | 6/2001 | Divakaruni et al. | |
| 6,291,286 B1 | 9/2001 | Hsiao | |
| 6,297,089 B1 | 10/2001 | Coronel et al. | |
| 6,326,658 B1 | 12/2001 | Tsunashima et al. | |
| 6,344,390 B1 | 2/2002 | Bostelmann et al. | |
| 6,426,526 B1 | 7/2002 | Divakaruni et al. | |
| 6,437,401 B1 * | 8/2002 | Mandelman et al. | 257/330 |
| 6,498,061 B2 | 12/2002 | Divakaruni et al. | |
| 6,573,137 B1 | 6/2003 | Divakaruni et al. | |
| 6,579,759 B1 | 6/2003 | Chudzik et al. | |
| 6,734,078 B2 | 5/2004 | Chu | |
| 6,864,191 B2 * | 3/2005 | Yoon | 438/778 |
| 7,019,350 B2 | 3/2006 | Hsu | |
| 7,074,689 B2 | 7/2006 | Gutsche et al. | |
| 7,682,896 B2 * | 3/2010 | Ho et al. | 438/243 |
| 7,737,482 B2 * | 6/2010 | Cheng et al. | 257/301 |
| 2002/0024082 A1 | 2/2002 | Tsunashima et al. | |
| 2002/0195637 A1 * | 12/2002 | Kokubun | 257/301 |
| 2003/0109140 A1 | 6/2003 | Lee | |
| 2005/0090053 A1 * | 4/2005 | Temmler et al. | 438/243 |
| 2006/0084223 A1 | 4/2006 | Seidl | |
| 2006/0134877 A1 | 6/2006 | Goebel et al. | |
| 2007/0057302 A1 * | 3/2007 | Ho et al. | 257/301 |
| 2007/0238244 A1 * | 10/2007 | Lin et al. | 438/243 |

* cited by examiner

*Primary Examiner* — Eugene Lee
*Assistant Examiner* — Monica D Harrison
(74) *Attorney, Agent, or Firm* — Cantor Colburn LLP; Joseph Abate

(57) ABSTRACT

A method of forming an integrated circuit comprises: providing a semiconductor topography comprising an active transistor laterally adjacent to a trench capacitor formed in a semiconductor substrate, the active transistor comprising a source junction and a drain junction, wherein a barrier layer is disposed along a periphery of the trench capacitor for isolating the trench capacitor; forming an interlevel dielectric across the semiconductor topography; concurrently etching (i) a first opening through the interlevel dielectric to the drain junction of the active transistor and the trench capacitor, and (ii) a second opening through the interlevel dielectric to the source junction of the active transistor; and filling the first opening and the second opening with a conductive material to form a strap for electrically connecting the trench capacitor to the drain junction of the active transistor and to also form a contact for electrically connecting the source junction to an overlying level of the integrated circuit.

9 Claims, 11 Drawing Sheets

INTEGRATED CIRCUITS COMPRISING AN ACTIVE TRANSISTOR ELECTRICALLY CONNECTED TO A TRENCH CAPACITOR BY AN OVERLYING CONTACT AND METHODS OF MAKING

BACKGROUND

1. Field of the Invention

This invention relates to integrated circuits, and particularly to fabricating integrated circuits comprising an active transistor electrically connected to a drain junction of a trench capacitor by an overlying contact formed between the active transistor and another passive transistor.

2. Description of Background

Dynamic random access memory (DRAM) technology stores each bit of data in a separate capacitor. A DRAM cell includes a field effect transistor (FET) and a capacitor fabricated upon and within a semiconductor substrate. To meet the demand for integrated circuits with high integration densities and minimum feature sizes, trench capacitors have been developed for use in DRAM cells. Trench capacitors extend into the substrate of a DRAM cell rather than across the surface of the substrate and thus require little additional space.

Current DRAM cells include a buried strap for electrically connecting a drain region of a FET to the top of a trench capacitor that comprises doped polysilicon. Unfortunately, directly contacting the drain region to the trench capacitor may generate crystalline defects that can cause a relatively large leakage current to pass from the buried strap through the channel of the FET and to the source, thereby destroying the stored data. To prevent such leakage, a barrier layer can be formed between the strap/trench capacitor structure and the drain region of the FET. However, this barrier layer needs to be sufficiently thin to allow dopants to out diffuse and to allow current to flow through the barrier layer. Further, the presence of the barrier layer can undesirably increase the temperature required for this out-diffusion. However, at higher temperatures, the dopant diffusion can be so high that the FET experiences a change in its threshold voltage, $V_T$.

An improved DRAM cell has been developed that includes silicide upon the surfaces of the buried strap, the trench capacitor, and the source and drain (source/drain) junctions of the FET. However, a barrier layer is still positioned at the edge of the buried strap that can lead to disconnect between the source/drain silicide and the capacitor silicide.

BRIEF SUMMARY

The shortcomings of the prior art are overcome and additional advantages are provided through the provision of methods of fabricating an active transistor electrically connected to a drain junction of a trench capacitor by an overlying contact extending through an interlevel dielectric between the active transistor and another passive transistor. In an embodiment, a method of forming an integrated circuit comprises: providing a semiconductor topography comprising an active transistor laterally adjacent to a trench capacitor formed in a semiconductor substrate, the active transistor comprising a source junction and a drain junction, wherein a barrier layer is disposed along a periphery of the trench capacitor for isolating the trench capacitor; forming an interlevel dielectric across the semiconductor topography; concurrently etching (i) a first opening through the interlevel dielectric to the drain junction of the active transistor and the trench capacitor, and (ii) a second opening through the interlevel dielectric to the source junction of the active transistor; and filling the first opening and the second opening with a conductive material to form a strap for electrically connecting the trench capacitor to the drain junction of the active transistor and to also form a contact for electrically connecting the source junction to an overlying level of the integrated circuit.

In another embodiment, an integrated circuit comprises: an active transistor laterally adjacent to a trench capacitor formed in a semiconductor substrate, the active transistor comprising a source junction and a drain junction, wherein a barrier layer is disposed along a periphery of the trench capacitor for isolating the trench capacitor; a passive transistor laterally spaced from the active transistor, wherein at least a portion of the trench capacitor is interposed between the active and passive transistors; an interlevel dielectric disposed upon the active and passive transistors; and a first conductive contact extending through the interlevel dielectric to the drain junction of the active transistor and said at least a portion of the trench capacitor between the active and passive transistors, wherein the first conductive contact electrically connects the trench capacitor to the drain junction of the active transistor.

In yet another embodiment, a design structure tangibly embodied in a machine readable medium for designing, manufacturing, or testing a design comprises: an active transistor laterally adjacent to a trench capacitor formed in a semiconductor substrate, the active transistor comprising a source junction and a drain junction, wherein a barrier layer is disposed along a periphery of the trench capacitor for isolating the trench capacitor; a passive transistor laterally spaced from the active transistor, wherein at least a portion of the trench capacitor is interposed between the active and passive transistors; an interlevel dielectric disposed upon the active and passive transistors; and a first conductive contact extending through the interlevel dielectric to the drain junction of the active transistor and said at least a portion of the trench capacitor between the active and passive transistors, wherein the first conductive contact electrically connects the trench capacitor to the drain junction of the active transistor.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Turning now to the drawings in greater detail, it will be seen that FIGS. 1-10 illustrate an exemplary embodiment of a method for fabricating an integrated circuit, particularly a DRAM circuit, comprising a trench capacitor electrically connected to a drain junction of an active transistor by an overlying conductive contact. This overlying contact extends through an interlevel dielectric between the active transistor and another passive transistor laterally spaced from the active transistor and thus serves as a surface strap as opposed to a buried strap for coupling the active transistor to the trench capacitor. As used herein, the term "active transistor" refers to a field effect transistor comprising doped source and drain junctions spaced apart by an oppositely doped channel region in a semiconductor substrate and a gate electrode dielectrically spaced above the channel region. In contrast, the term "passive transistor" refers to a structure comprising a gate electrode but no source and drain junctions or channel region. Positioning the strap in the level above the semiconductor substrate can prevent current from leaking from the strap into the channel region of the active transistor. Since the strap is a conductive contact as opposed to a semiconductive material, there is no need to diffuse dopants from the trench capacitor into the strap. As such, a relatively thick barrier layer can be used at the periphery of the trench capacitor to prevent dopants from migrating out of the capacitor. Further, the strap can be formed in the interlevel dielectric concurrent with forming a conductive contact to the source junction of the active transistor, thereby eliminating any extra mask steps that would otherwise be required to form a separate strap above the surface of the substrate.

Figure 1:
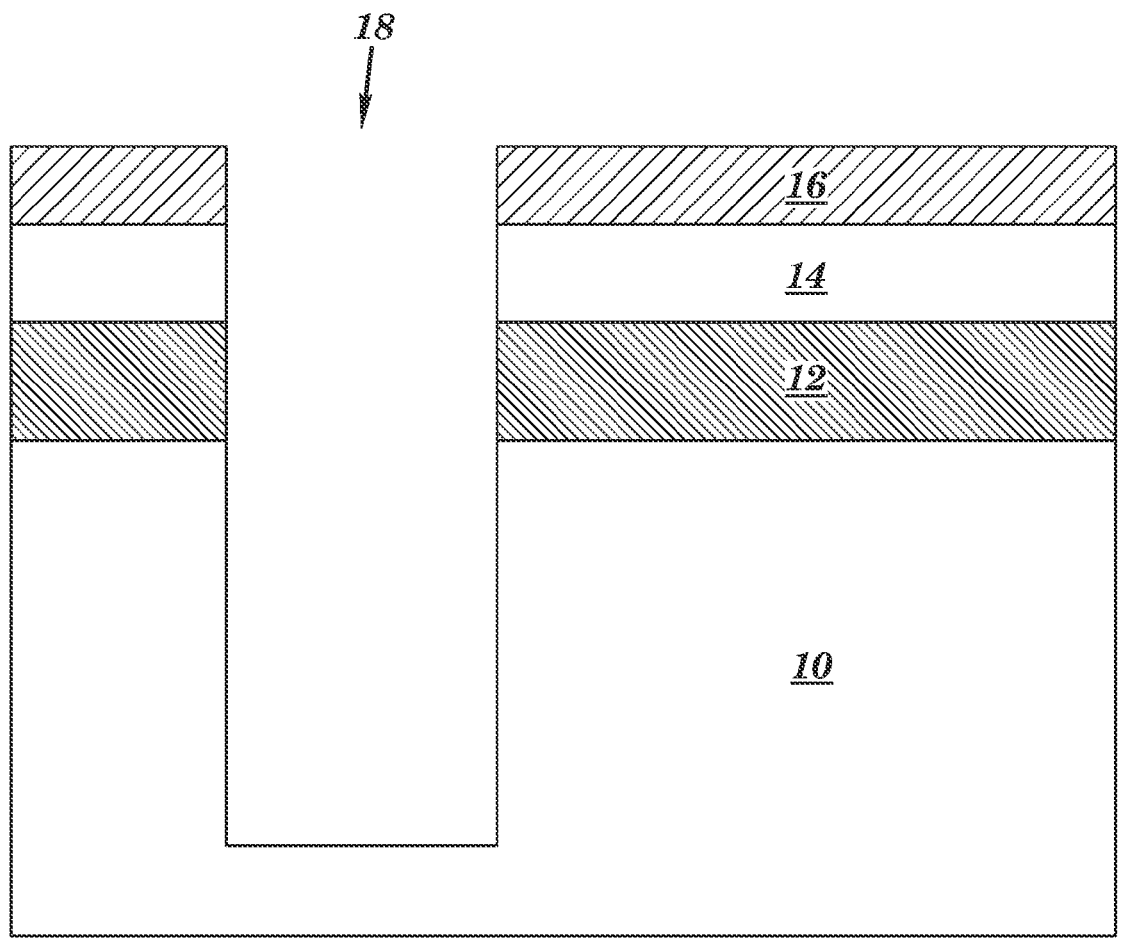
FIGS. 1-10 illustrate an exemplary embodiment of a method for fabricating an integrated circuit comprising an active transistor electrically connected to a drain junction of a trench capacitor by an overlying contact.

As shown in FIG. 1, the above-mentioned method first involves forming the following layers of an integrated circuit: a substrate 10, e.g., a silicon-based substrate; an insulation layer 12 upon the substrate 10; and a semiconductive layer 14 comprising, e.g., single crystalline silicon doped with n-type or p-type dopants, upon the insulation layer 12. The structure formed in the foregoing manner is a silicon-on-insulator (SOI) structure. The SOI structure can be fabricated by any suitable technique, such as a wafer bonding technique or a separation by implantation of oxygen (SIMOX) technique, both of which are familiar to a person having ordinary skill in the art. A pad dielectric 16, e.g., silicon nitride with an optional underlying silicon oxide layer, can then be formed across the semiconductive layer 14, for example, by chemical vapor deposition (CVD). After the formation of the pad dielectric 16, a relatively deep trench 18 can be formed that extends through the pad dielectric 16, the semiconductive layer 14, the insulation layer 12, and a portion of the substrate 10 using lithography and an anisotropic etch technique, e.g., reactive ion etching (RIE). In an alternative embodiment, the pad dielectric 16 can be formed across a semiconductor substrate rather than an SOI structure, and the trench can be formed in that substrate.

Figure 2:
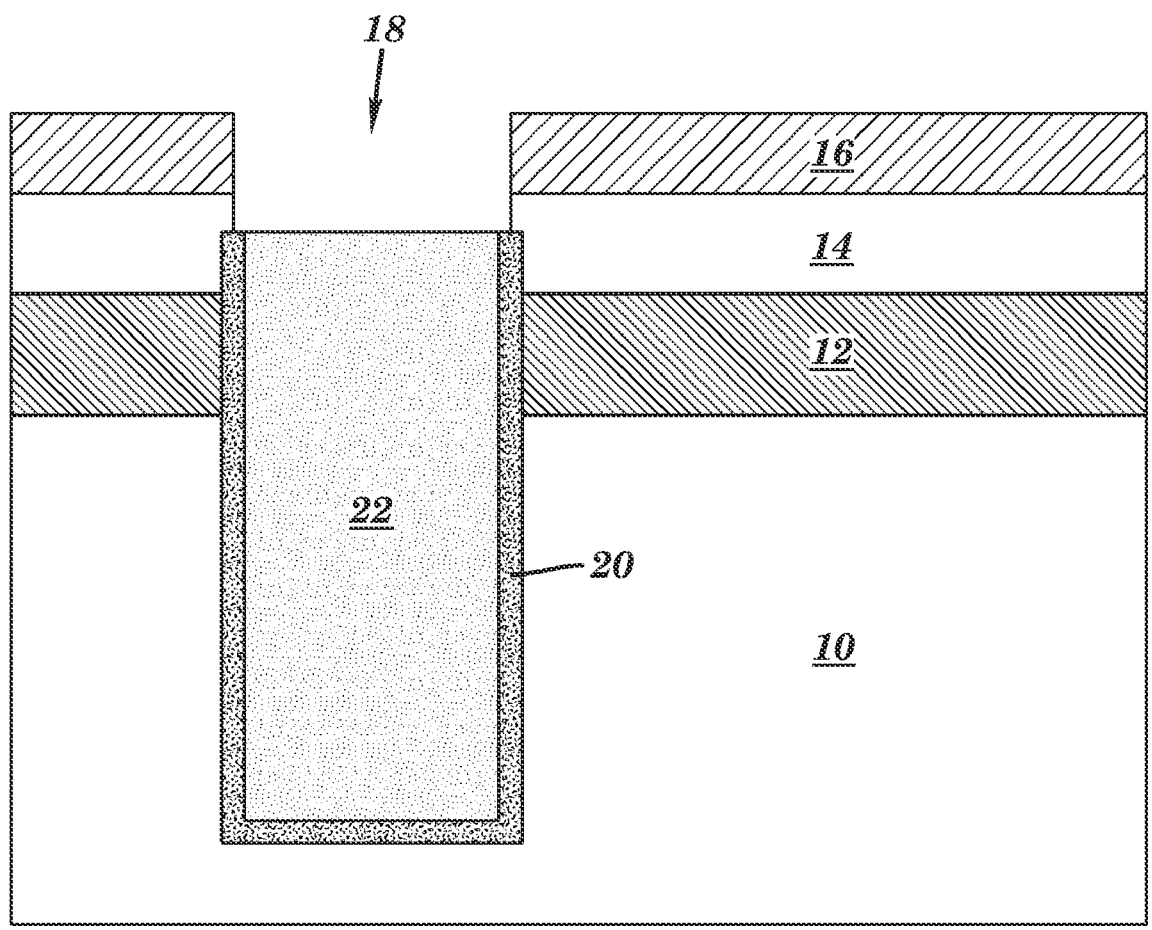

Next, as depicted in FIG. 2, a barrier layer 20 can be along the periphery and bottom of the trench 18 and the upper surface of the pad dielectric 16, followed by depositing a conductive material 22, into the trench 18 to a level above the pad dielectric 16. The barrier layer 20 is a dielectric material that is suitable for a node dielectric of a capacitor and for inhibiting dopants from migrating from the conductive material 22 into an adjacent material. Examples of suitable barrier layer materials include but are not limited to silicon oxide, silicon nitride, silicon oxynitride, a high-k material having a relative permittivity greater than about 7, or a combination comprising at least one of the foregoing materials. The barrier layer 20 can be formed by any suitable method, including but not limited to, thermal oxidation, chemical oxidation, thermal nitridation, atomic layer deposition (ALD), CVD, or a combination comprising at least one of the foregoing methods. In one embodiment, the barrier layer 20 comprises silicon oxynitride formed by CVD. The thickness of the barrier layer 20 is desirably effective to prevent the passage of dopants through the barrier layer 20. For example, the barrier layer thickness can be about 2 nanometers (nm) to about 20 nm, more specifically about 4 nm to 10 nm, and even more specifically about 5 nm to 7 nm.

The conductive material 22 can be any suitable conducting material, including but not limited to, amorphous silicon, polycrystalline silicon (polysilicon), amorphous or polycrystalline germanium, silicon germanium, a metal (e.g., tungsten, titanium, tantalum, ruthenium, cobalt, copper, or aluminum), a conducting metallic compound material (e.g., tungsten silicide, tungsten nitride, titanium nitride, tantalum nitride, ruthenium oxide, cobalt silicide, or nickel silicide), or a combination comprising at least one of the foregoing materials. The conductive material 22 can be deposited by any suitable method, including but not limited to, low-pressure chemical vapor deposition (LPCVD), metalorganic chemical vapor deposition (MOCVD), ALD, physical vapor deposition (PVD), sputtering, plating, evaporation, ion beam deposition, electron beam deposition, laser assisted deposition, or a combination comprising at least one of the foregoing methods. In one embodiment, the conductive material 22 is doped polysilicon deposited by LPCVD. The conductive material 22 may be in-situ doped during deposition, e.g., by arsenic and/or phosphorus. The dopants in the conductive material 22 can be activated via a subsequent anneal step. The doped conductive material 22, the substrate 10, and the barrier layer 20 form a trench capacitor in the ensuing integrated circuit with the doped conductive material 22 and the substrate 10 acting as two electrodes and the barrier layer 20 acting as the capacitor dielectric. The substrate 10 may be optionally doped (not shown).

FIG. 2 also shows the etch of the barrier layer 20 and the conductive material 22 back to a level below the upper surface of the semiconductive layer 14. The pad dielectric 16 protects the removal of the underlying semiconductive layer 14 during the etchback process.

Figure 3:
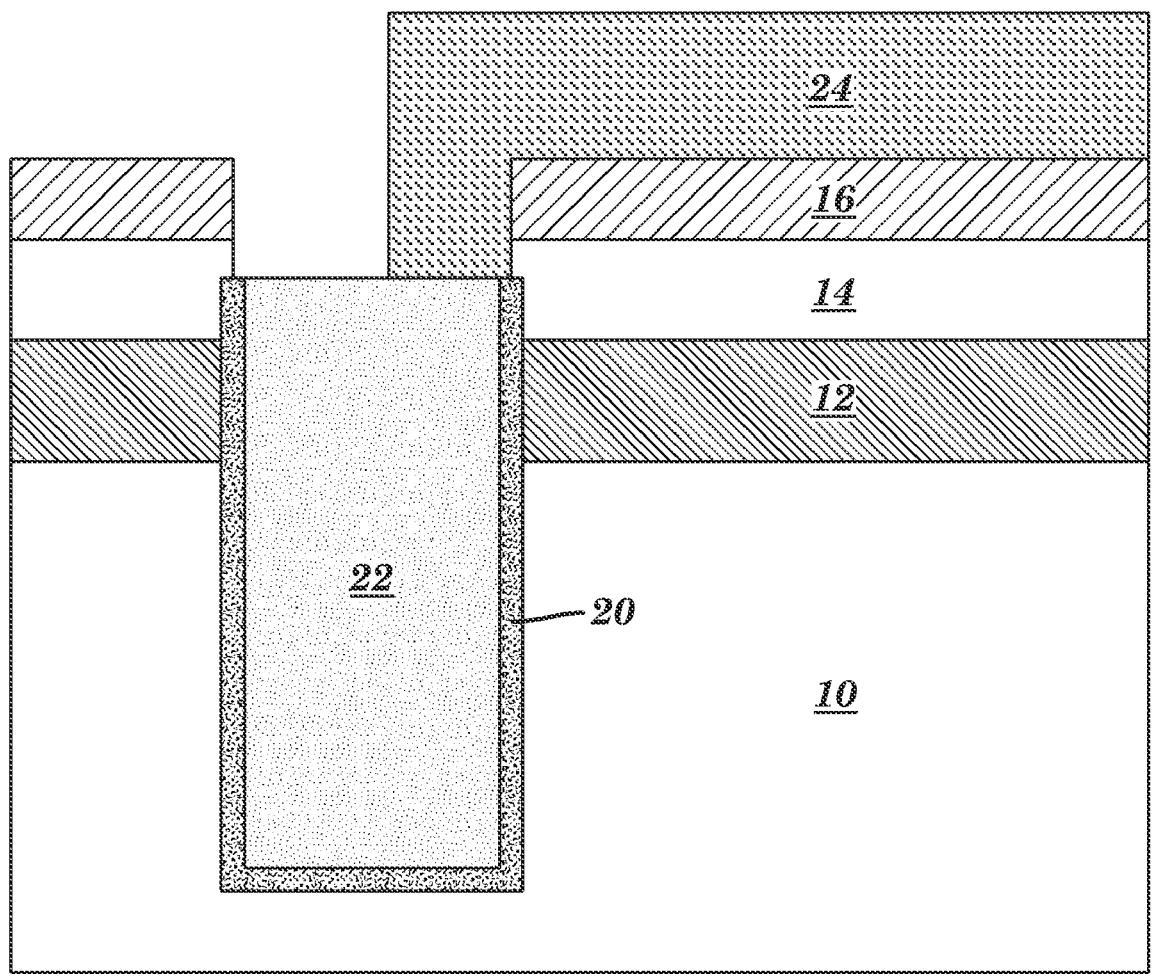
Figure 4:
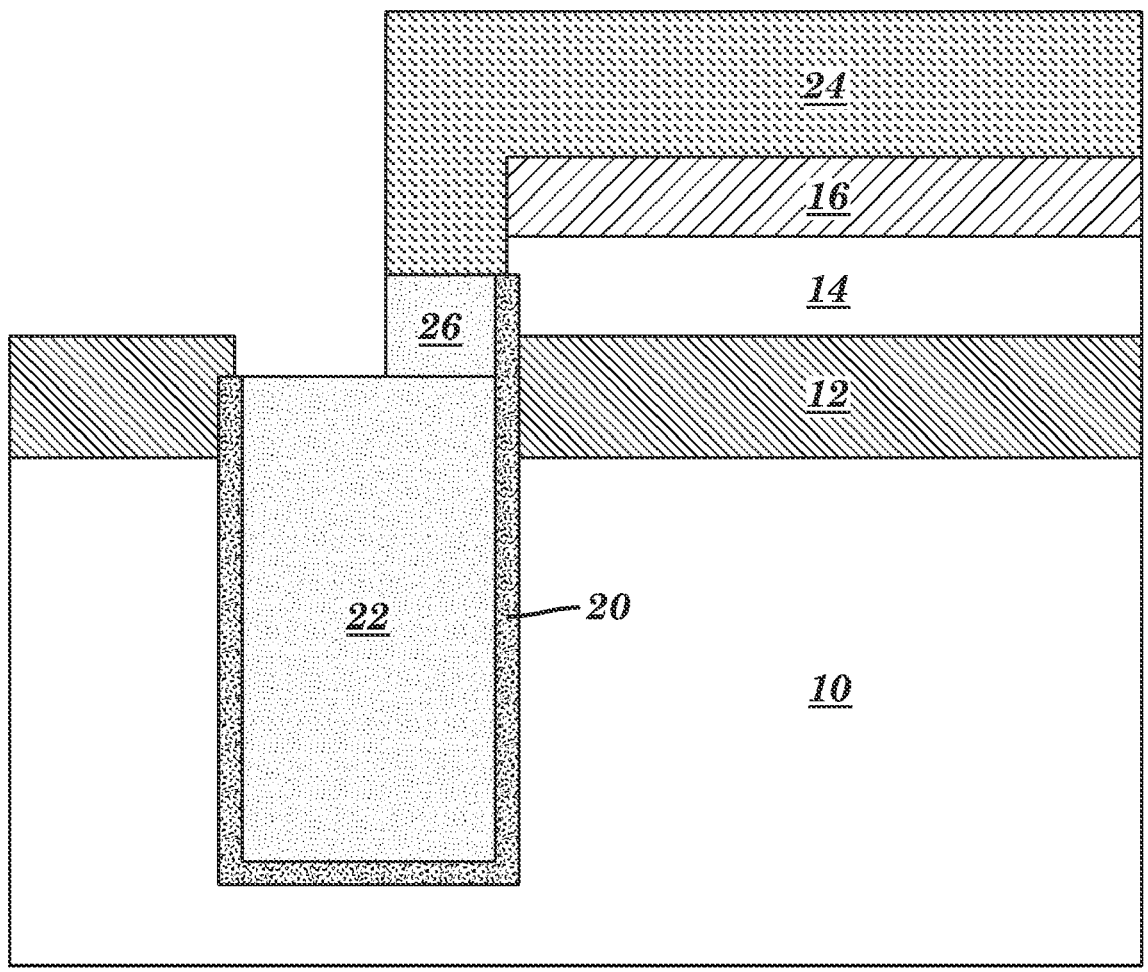
Figure 5:
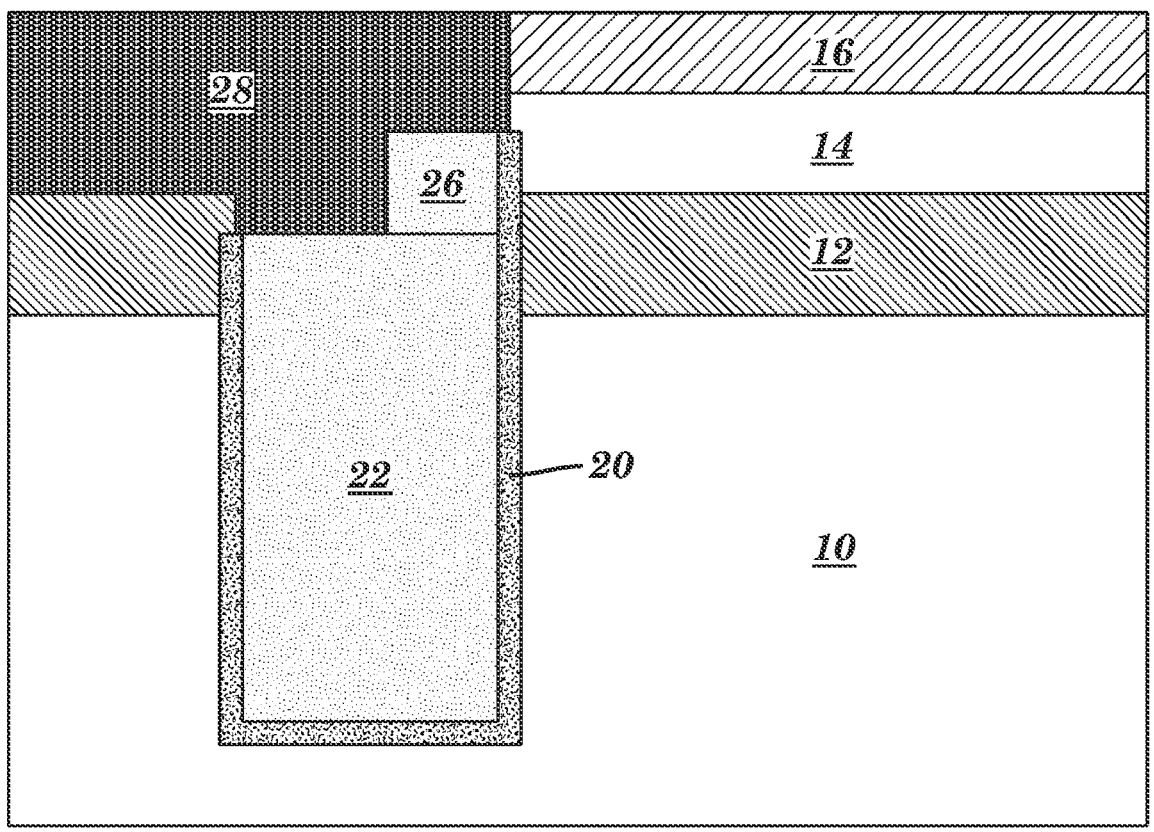
Figure 6:
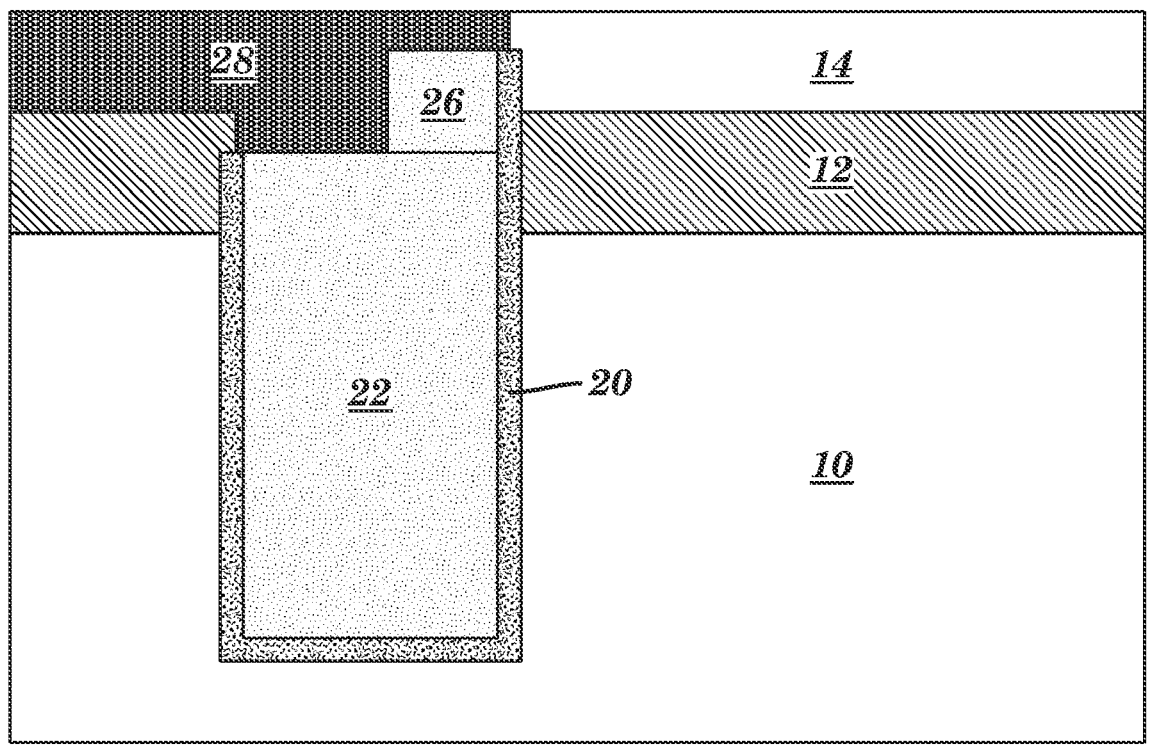

Turning to FIG. 3, an etch mask 24 can be subsequently formed upon a portion of the conductive material 22 and a portion of the pad dielectric 16. The etch mask 24 can be, for example, a photoresist layer patterned using lithography or a hard mask etched in the presence of an overlying photoresist layer. Next, as shown in FIG. 4, portions of the pad dielectric 16, the semiconductive layer 14, the barrier layer 20, and the conductive material 22 exposed by the mask 24 can be etched using, e.g., RIE. As a result, a portion of the conductive material 22 becomes recessed below another portion, i.e., a protrusion portion 26. Thereafter, the etch mask 24 can be removed, followed by depositing a dielectric, e.g., silicon oxide, across exposed portions of the insulation layer 12, the conductive material 22, including the protrusion portion 26, and the pad dielectric 16. The dielectric can then be removed back to a level substantially coplanar with the upper surface of the pad dielectric 16 via, e.g., chemical-mechanical polishing (CMP), to form a shallow trench isolation (STI) structure 28, as depicted in FIG. 5. The pad dielectric 16 can then be selectively etched to expose the underlying semiconductive layer 14, as shown in FIG. 6. An upper portion of the STI structure 28 can also be removed during this etch.

Figure 7:
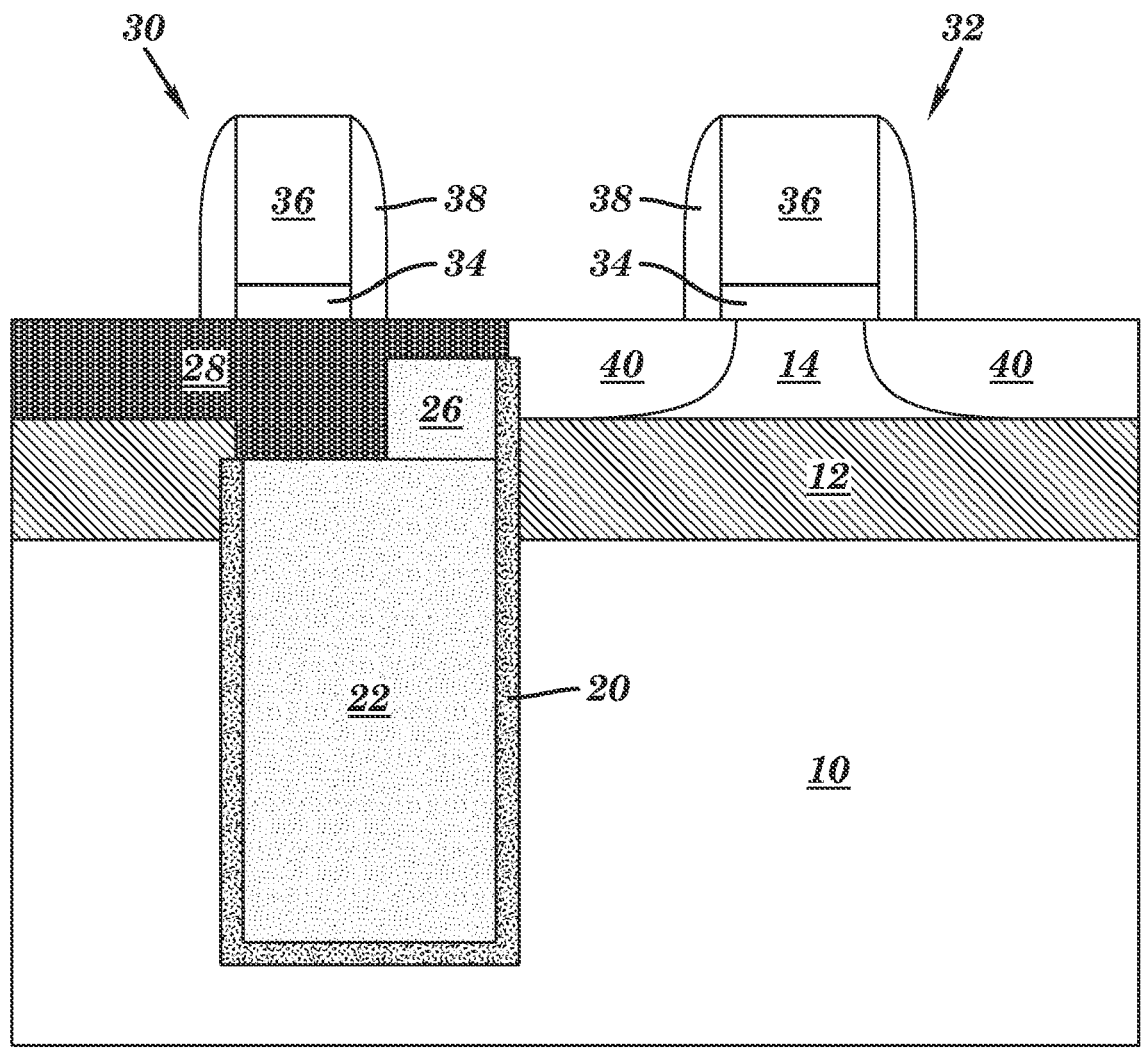

Subsequently, as illustrated in FIG. 7, a passive transistor 30 can be formed upon the STI structure 28, and an active transistor 32 can be formed upon and within semiconductive layer 14 such that the protrusion portion 26 of the trench capacitor is positioned between the passive and active transistors 30 and 32. The formation of the passive and active transistors 30 and 32 can entail patterning gate dielectrics 34 and gate electrodes 36. The gate dielectrics 34 can comprise a dielectric material, including but not limited to, silicon oxide, silicon nitride, silicon oxynitride, a high-k dielectric, or a combination comprising at least one of the foregoing materials. The gate electrodes 36 can comprise a conductive material, including but not limited to, amorphous silicon, polysilicon, polycrystalline silicon germanium, a metal, a conductive metallic compounds, or a combination comprising at least one of the foregoing materials. Optionally, lightly or heavily doped regions can be implanted into semiconductive layer 14 that are self-aligned to the sidewalls of the second gate electrode 36. Dielectric spacers 38 can then be formed upon the sidewall surfaces of the gate electrodes 36 using CVD followed by an anisotropic etch technique such as RIE. Next, heavily doped source and drain (S/D) junctions 40 that are aligned to the sidewalls of the dielectric spacers 38 can be formed in the semiconductive layer 14 through the implantation of dopants, thereby completing the formation of the active transistor 32. In contrast, the passive transistor 30 is located on the STI structure 28 and includes no S/D junctions. The gate electrodes 36 can be implanted at the same time as the S/D junctions 40. The dopants employed for the S/D implantation are opposite in type from the dopants implanted into semiconductive layer 14. If the active transistor 32 is an NFET, the S/D junctions 40 can be implanted with n-type dopants, whereas if the active transistor 32 is a PFET, the S/D junctions 40 can be implanted with p-type dopants. Examples of n-type dopants include but are not limited to arsenic and phosphorus, and examples of p-type dopants include but are not limited to boron and boron difluoride. The dopants in gate electrodes 36 and the S/D junctions 40 can be activated using a subsequent anneal step.

Figure 8:
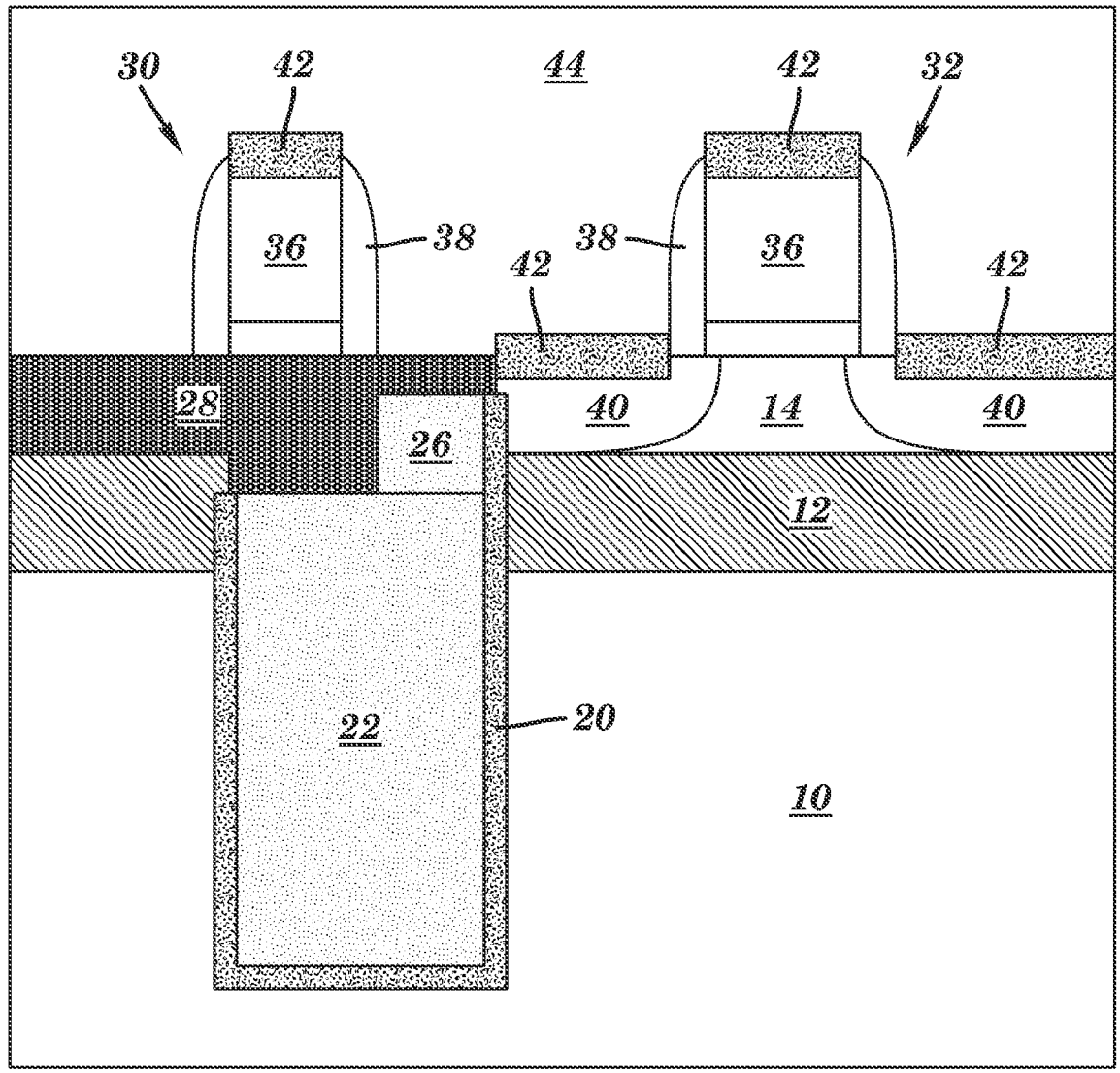
Figure 9:
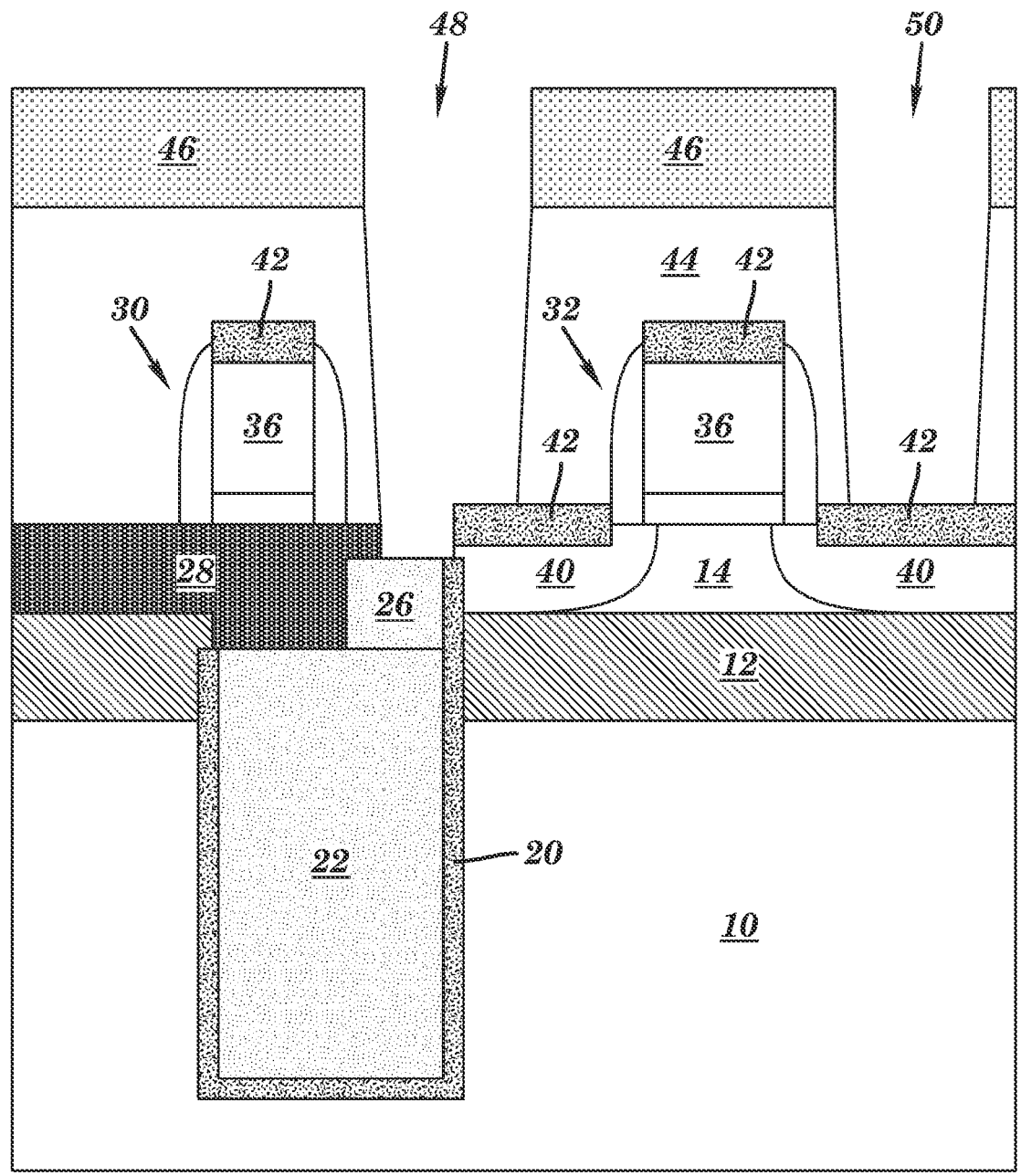
Figure 10:
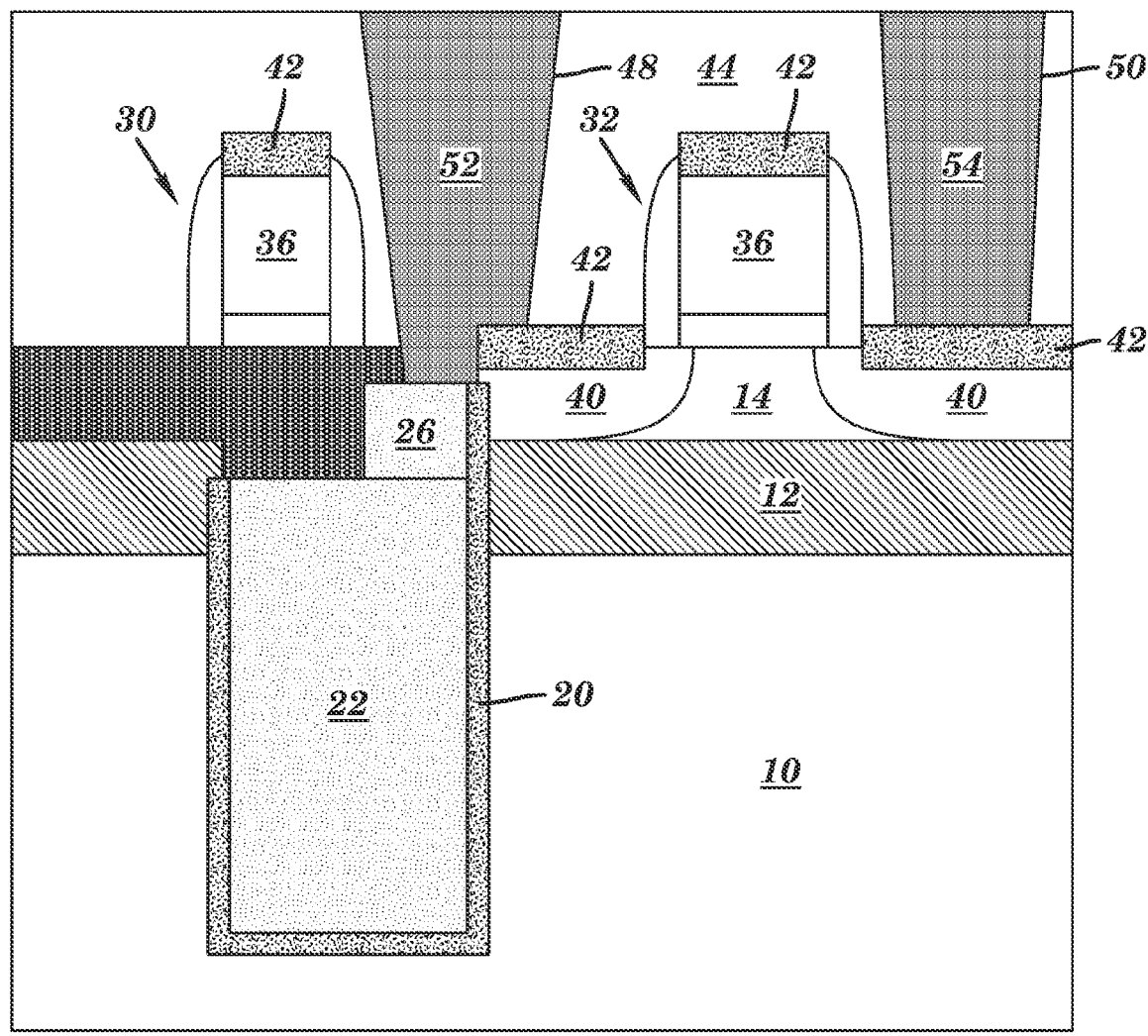

Turning to FIG. 8, metal silicide 42 can be formed upon gate electrodes 36 and S/D junctions 40 via sputter deposition of a metal followed by an anneal of the metal to react it with adjacent silicon atoms. The unreacted metal can then be removed. Next, an interlevel dielectric 44 comprising, e.g., silicon oxide or borophosphosilicate glass (BPSG), can be deposited across the active and inactive transistors 30 and 32 and planarized using, e.g., CMP. Optionally, the interlevel dielectric 44 may include a liner material (e.g., silicon nitride) that is formed before depositing the silicon oxide or BPSG. Thereafter, as depicted in FIG. 9, an etch mask layer 46 can be patterned (e.g., by lithography and RIE) upon the interlevel dielectric 44 to expose select portions of the interlevel dielectric 44. First and second openings 48 and 50 can then be concurrently etched in the exposed portions of the interlevel dielectric 44 using, e.g., RIE. The first opening 48 exposes the protrusion portion 26 of the trench capacitor and the drain-side silicide 42, and the second opening 50 exposes the source-side silicide 42. Finally, as shown in FIG. 10, a conductive material (e.g., tungsten and/or copper) can be deposited into openings 48 and 50 to a level above the interlevel dielectric 44 and then removed back to the surface of the interlevel dielectric 44 using, e.g., CMP. In this manner, the openings 48 and 50 can be filled with a conductive material to form i) a contact or strap 52 for electrically connecting the protrusion portion 26 of the trench capacitor to the drain-side junction 40 of the active transistor 32 and ii) a contact 54 for electrically connecting the source-side junction 40 to an overlying level of the integrated circuit. A liner material (e.g., titanium, titanium nitride, and/or tantalum) can be deposited on the bottom and sidewalls of the openings 48 and 50 before completely filling those openings by the conductive material. The conductive material and the liner material can be deposited by any suitable method, including but not limited to, PVD, CVD, ALD, sputtering, plating, evaporation, spin-on-coating, ion beam deposition, electron beam deposition, laser assisted deposition, chemical solution deposition, or a combination comprising at least one of the foregoing methods.

Figure 11:
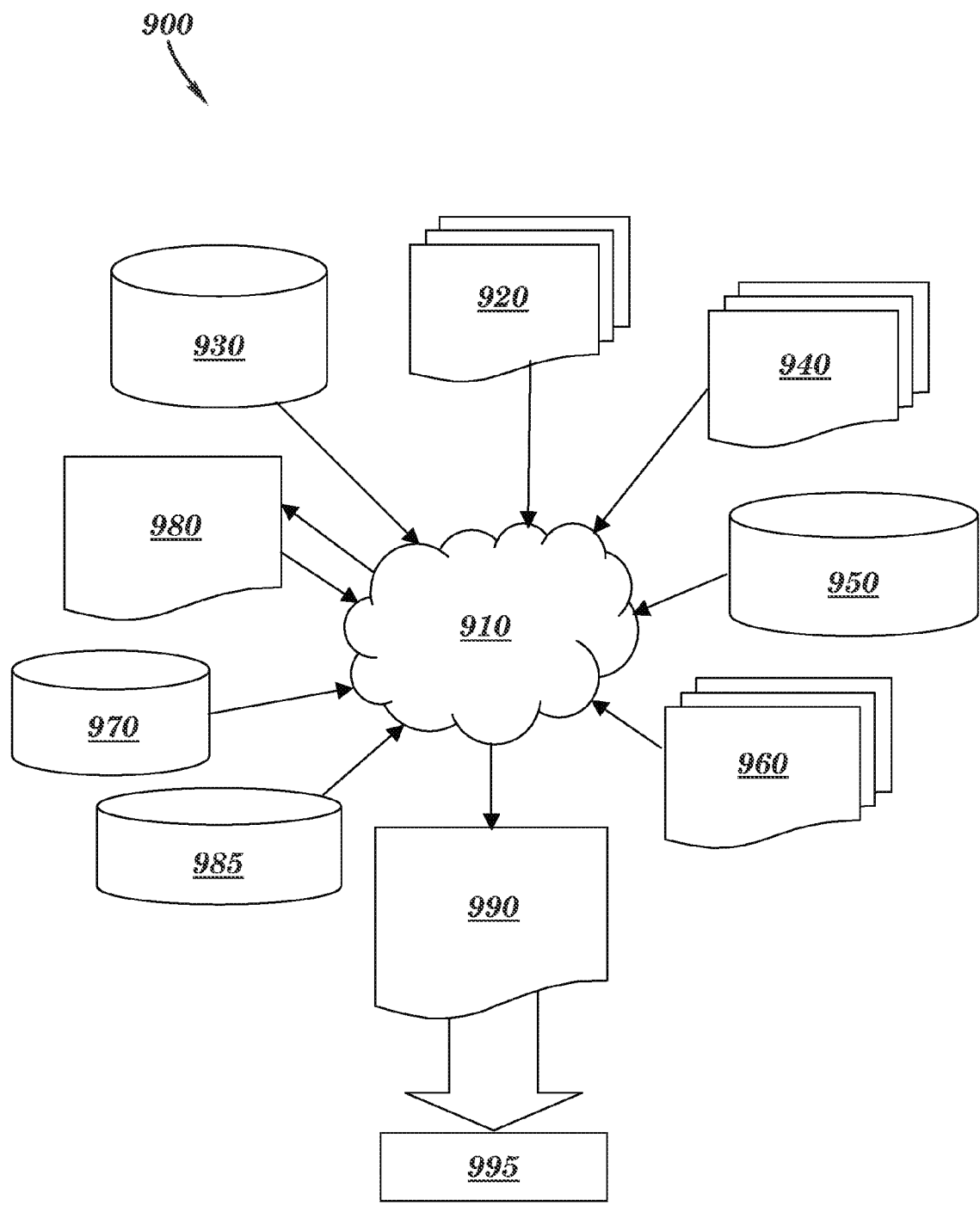
FIG. 11 is a flow diagram of a design process used in semiconductor design, manufacture, and/or testing.

FIG. 11 illustrates a block diagram of an exemplary design flow 900 used for example, in semiconductor integrated circuit (IC) logic design, simulation, testing, layout, and manufacture. Design flow 900 includes processes and mechanisms for processing design structures or devices to generate logically or otherwise functionally equivalent representations of the design structures and/or devices described above and shown in FIG. 10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is desirably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIG. 10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 desirably employs and incorporates hardware and/or software modules for synthesizing, translating, or otherwise processing a design/simulation functional equivalent of the component, circuit, device, or logic structure shown in FIG. 10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 desirably comprises one or more files, data structures, or other computer-encoded data or instructions that reside on transmission or data storage media and that when processed by an ECAD system generate a logically or otherwise functionally equivalent form of one or more of the embodiments described herein. In one embodiment, design structure 990 may comprise a compiled, executable HDL simulation model that functionally simulates the device shown in FIG. 10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer to produce a device or structure as described above and shown in FIG. 10. Design structure 990 may then proceed to a stage 995 where, for example, design structure 990 proceeds to tape-out, is released to manufacturing, is released to a mask house, is sent to another design house, is sent back to the customer, etc.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of forming an integrated circuit, comprising:
providing a semiconductor topography comprising an active transistor laterally adjacent to a trench capacitor formed in a semiconductor substrate, the active transistor comprising a source junction and a drain junction, wherein a barrier layer is disposed along a periphery of the trench capacitor for isolating the trench capacitor;
forming an interlevel dielectric across the semiconductor topography;
concurrently etching (i) a first opening through the interlevel dielectric to the drain junction of the active transistor and the trench capacitor, and (ii) a second opening through the interlevel dielectric to the source junction of the active transistor; and
filling the first opening and the second opening with a conductive material to form a strap for electrically connecting the trench capacitor to the drain junction of the active transistor and to also form a contact for electrically connecting the source junction to an overlying level of the integrated circuit.

2. The method of claim 1, wherein the semiconductor topography further comprises a passive transistor laterally spaced from the active transistor, wherein at least a portion of the trench capacitor is interposed between the active and passive transistors, and wherein the first opening is etched to said at least a position of the trench capacitor.

3. The method of claim 2, wherein the semiconductor topography further comprises a semiconductive layer disposed upon an insulation layer which is disposed upon the semiconductor substrate, and wherein the trench capacitor is formed by:
etching a trench through a pad dielectric formed upon the semiconductive layer, the semiconductive layer itself, the insulation layer, and the semiconductor substrate;
depositing the barrier layer on the periphery of the trench and on the pad dielectric;

depositing another conductive material into the trench and to a level above the upper surface of the pad dielectric; and removing the barrier layer and the conductive material from all areas except within the trench such that an upper surface of said another conductive material in the trench is recessed below an upper surface of the insulation layer.

4. The method of claim 3, wherein forming the trench capacitor further comprises:

forming a mask upon a first portion of said another conductive material in the trench and upon a portion of the pad dielectric;

etching a second portion of said another conductive material exposed by the mask such that the second portion becomes recessed below the first portion, wherein an exposed portion of the pad dielectric and an underlying portion of the semiconductive layer are etched away during the etch of the second portion of said another conductive material to expose a portion of the insulation layer; and removing the mask.

5. The method of claim 4, wherein the passive transistor is formed by:

forming an isolation structure upon the exposed portion of the insulation layer and the first and second portions of said another conductive material in the trench;

removing the pad dielectric; and forming a gate dielectric and a gate electrode of the passive transistor upon the isolation structure above the second portion of the conductive material in the trench.

6. The method of claim 5, wherein the gate dielectric and the gate electrode of the passive transistor are formed at the same time as another gate dielectric and another gate electrode of the active transistor are formed upon a remaining portion of the semiconductive layer.

7. The method of claim 3, wherein said another conductive material comprises polysilicon.

8. The method of claim 2, wherein the active transistor comprises metal silicide disposed upon its gate electrode and the source and drain junctions thereof, and the passive transistor comprises metal silicide disposed its gate electrode.

9. The method of claim 1, wherein the barrier layer comprises silicon nitride having a thickness of about 2 nm to about 20 nm.

* * * * *